United States Patent
Suehiro et al.

[11] Patent Number: 6,080,336
[45] Date of Patent: Jun. 27, 2000

[54] VIA-FILLING CONDUCTIVE PASTE COMPOSITION

[75] Inventors: Masatoshi Suehiro, Kyoto; Nobuaki Morishima, Toyonaka, both of Japan

[73] Assignee: Kyoto Elex Co., Ltd., Kyoto, Japan

[21] Appl. No.: 09/330,921

[22] Filed: Jun. 11, 1999

[30] Foreign Application Priority Data

Jun. 19, 1998 [JP] Japan ................................ 10-173047

[51] Int. Cl.[7] ...................................................... H01B 1/02
[52] U.S. Cl. ........................ 252/514; 174/265; 174/257; 174/259; 523/458; 252/512
[58] Field of Search ..................... 252/512–514, 252/511; 174/265, 257, 259; 523/458

[56] References Cited

U.S. PATENT DOCUMENTS

| | | | |
|---|---|---|---|
| 4,888,135 | 12/1989 | Tsunaga et al. | 252/512 |
| 5,914,358 | 6/1999 | Kawajima et al. | 523/458 |
| 5,951,918 | 9/1999 | Kuwajima et al. | 252/514 |
| 5,977,490 | 11/1999 | Kawajima et al. | 174/265 |

FOREIGN PATENT DOCUMENTS

| | | | |
|---|---|---|---|
| 01 231208 | 9/1989 | Japan . | |
| 01 251625 | 10/1989 | Japan | H01L 21/52 |
| 03 067402 | 3/1991 | Japan | H01B 1/22 |
| 06 336563 | 12/1994 | Japan | C09D 5/24 |
| 08 218006 | 8/1996 | Japan | C09D 5/24 |

*Primary Examiner*—Mark Kopec
*Assistant Examiner*—Derrick G. Hamlin
*Attorney, Agent, or Firm*—Marshall, O'Toole, Gerstein, Murray & Borun

[57] ABSTRACT

A conductive paste composition, which is superior in electrical connection reliability and has properties required for a via-filling conductive paste composition is disclosed. The via-filling conductive paste composition contains a solvent in an amount of not more than 5 parts by weight per 100 parts by weight of the total amount of components A to D:

A: 86 to 95 parts by weight of silver-coated copper particles made by coating surfaces of copper particles having an average particle diameter of 1 to 10 μm with silver, a proportion of silver to the total amount of copper particles and coated silver being from 0.5 to 20% by weight, B: 2 to 8 parts by weight of a liquid epoxy resin having two or more epoxy groups, C: 2 to 8 parts by weight of a resol-type phenol resin, and D: 0.5 to 5 parts by weight of a curing agent for an epoxy resin, wherein the composition has a viscosity not more than 1000 Pa·s.

4 Claims, 2 Drawing Sheets

VIA-FILLING CONDUCTIVE PASTE COMPOSITION

FIELD OF THE INVENTION

The present invention relates to a conductive paste composition for filling via holes of a printed circuit board to form interlayer electrical connections.

BACKGROUND OF THE INVENTION

With the recent reduction in size, weight, and thickness of electronic equipment, a high-density printed circuit board with a very high multilayer configuration has been developed.

On the other hand, a conventional multilayer printed circuit board is made by laminating a plurality of printed boards 1 as shown in FIG. 1, and conventionally, an interlayer electrical connection is formed by plating through holes 2 obtained by penetrating the multilayer printed circuit board. In FIG. 1, reference No. 3 denotes a printed wiring. It is necessary to plate these through holes of the multilayer board, and to plate holes serving as inner via holes between adjacent two layers. This inner via hole 7 is, for example, a hole installed on a substrate 5 of a single printed board 4 constituting the multilayer board, as shown in FIG. 2. In the case of this printed board 4, a copper foil 6 constituting a wiring pattern is fixed on both surfaces.

However, the production process is complicated because plating both the through hole 2 and an inner via hole 7 involve a wet process. Furthermore, when a through hole is formed, considerable limitations are placed on parts packaging of the printed circuit board, and it becomes impossible to perform high-density parts packaging.

Therefore, a method of forming an interlayer electrical connection by using a conductive paste has recently been suggested and put into practice. According to this method, it is possible to form an electrical connection between the respective layers at a predetermined position, thereby markedly improving packaging density.

The conductive paste used in a conventional printed circuit board is known as a conductive paste for a jumper circuit, a conductive paste for EMI (electromagnetic interference) shielding, or a conductive paste for a through hole. However, these conductive pastes have not been used for via-filling because they have not been specially designed for via-filling.

The properties required for a via-filling conductive paste composition for a printed circuit board are as follows:

(1) Increased contact probability between metal particles to reduce via connection resistance.
(2) Proper viscosity characteristics to allow screen printing.
(3) A conductive paste composition that firmly bonds to a copper foil.
(4) Absence of voids or cracks in the conductive paste filled in the vias.
(5) Minimal migration between adjacent vias.
(6) A sufficient useful life.
(7) Sufficient reliability (e.g., endures soldering shock test and heat cycle test).

Japanese Unexamined Patent Application Publication No. 7-176846 (hereinafter referred to as "prior publication 1") discloses a via hole-filling conductive paste composition comprising 80–92% by weight of a conductor filler having an average particle diameter of 0.5 to 20 $\mu$m and a specific surface area of 0.1 to 1.5 $m^2/g$, 8–20% by weight of an epoxy resin having two or more epoxy resins, which has a cold viscosity of not more than 15 Pa·s, and 0.5–5% by weight of a curing agent. Although prior publication 1 discloses an epoxy resin as the resin component, the epoxy resin alone cannot inhibit an increase in electric resistance when the conductor has been oxidized.

Japanese Unexamined Patent Application Publication No. 56-8892 (hereinafter referred to as "prior publication 2") discloses composite metal powders made by coating a copper powder with silver as a conductive paste for printed circuit board. However, the invention disclosed in prior publication 2 is used for the purpose of preventing a soft solder from transferring to the silver during soldering, not for the purpose of improving the reliability of an electrical connection between copper particles. Therefore, prior publication 2 does not disclose that the epoxy resin and resol-type phenol resin are used as a binder.

In addition, using copper particles as a conductor provides a benefit because copper is economically advantageous compared to gold, silver, and palladium as a noble metal, and is not as greatly influenced as these noble metals by a change in price resulting from a variation in demand. Copper also has a beneficial feature in that the electric resistance of copper is lower than that of nickel, tin, and lead. On the other hand, copper has a disadvantage in that it is inferior in operation reliability because it is oxidized more readily than gold, silver, palladium, nickel, tin, and lead. This is a particular disadvantage because a via-connected copper paste is gradually oxidized in an environment of high temperature and high humidity, and the electric resistance increases resulting in a broken printed wiring in a severe case.

As described above, a via-filling conductive paste composition having excellent characteristics has not yet been provided.

Under these circumstances, the present invention has been accomplished. In order to improve the reliability of an electrical connection between copper particles used as the conductor component, sufficient tests and technical studies have been performed to obtain proper properties for use as a via-filling conductive paste with respect to the proportion of the copper particles and the respective blending components. As a result, the present invention has been achieved. An object of the present invention, therefore, is to provide a conductive paste composition, which is superior in electrical connection reliability and has the above properties required of a via-filling conductive paste composition.

DETAILED DESCRIPTION OF THE PREFERRED EMBODIMENTS

Figure 1:
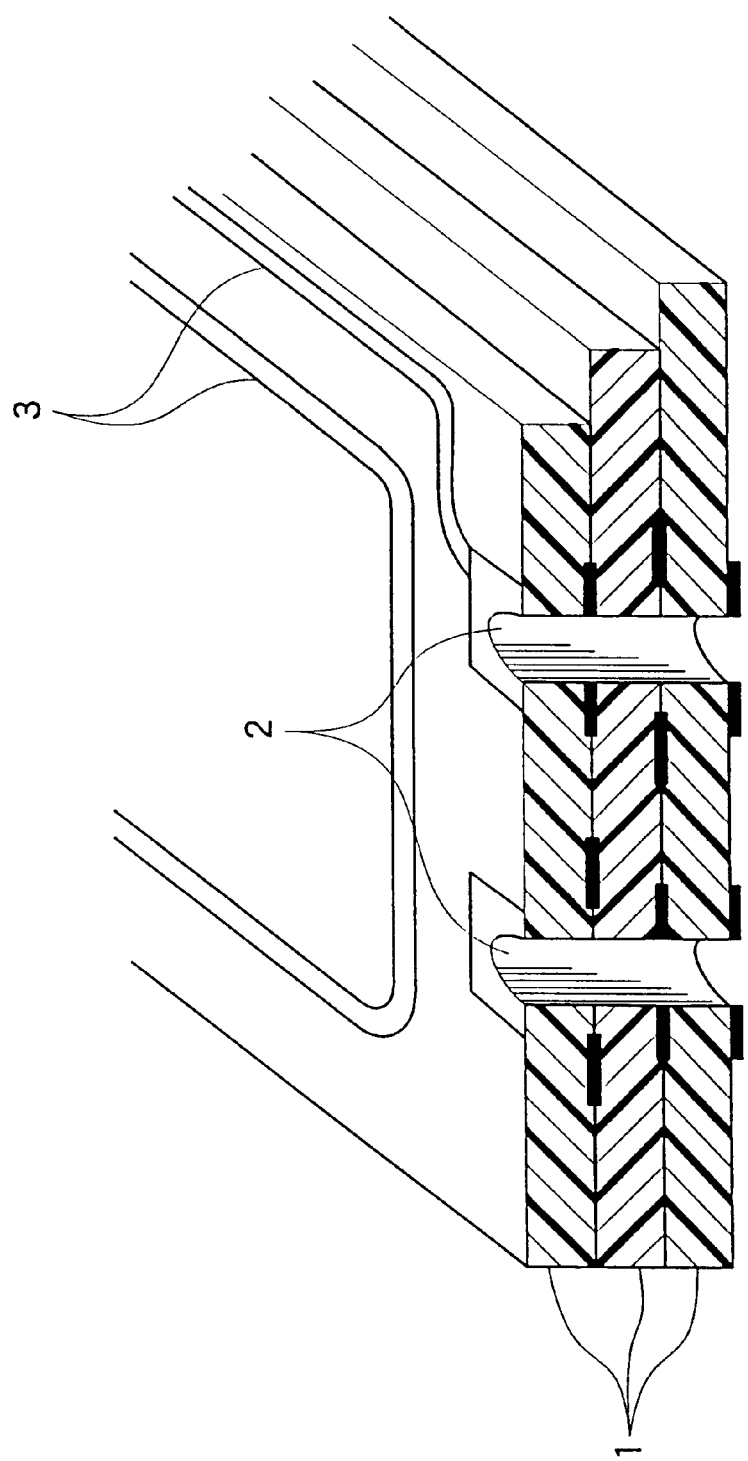
FIG. 1 shows a schematic diagonal view of a multilayer printed circuit board.
Figure 2:
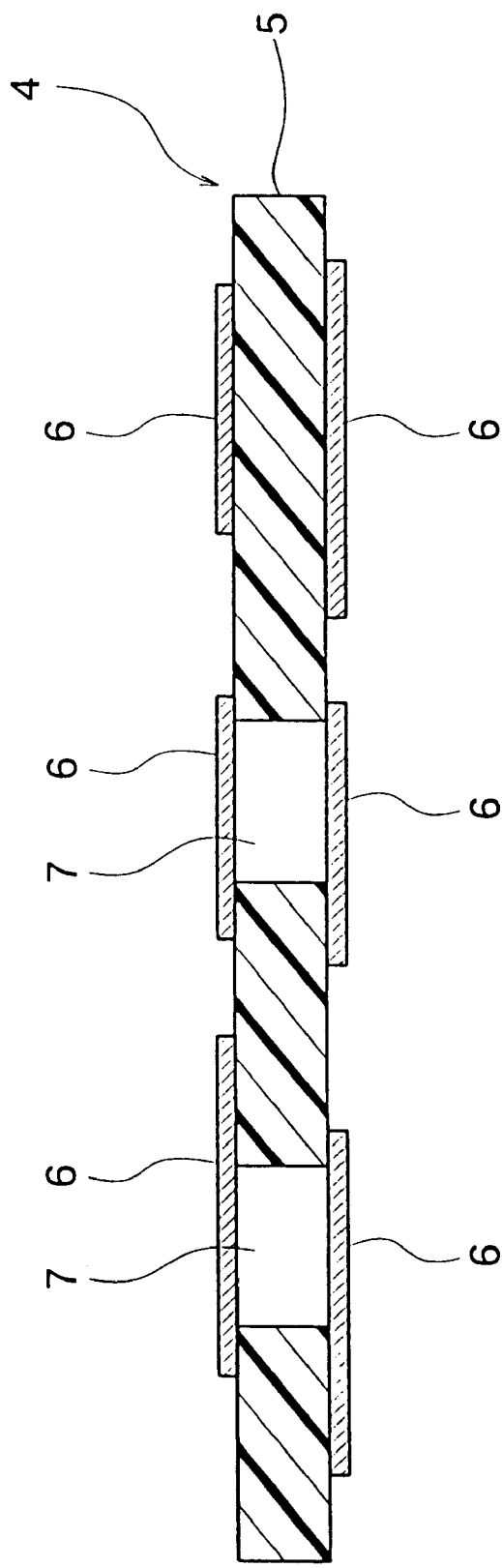
FIG. 2 shows a section of a single printed board.

To attain the above object, a conductive paste composition of the present invention for filling vias of a printed circuit board comprises a solvent in an amount of not more than 5 parts by weight per 100 parts by weight of the total amount of the following components A to D:

A: 86 to 95 parts by weight of silver-coated copper particles made by coating the surface of copper particles having an average particle diameter of 1 to 10 $\mu$m with silver, a proportion of silver to the total amount of copper particles and coated silver being from 0.5 to 20% by weight, B: 2 to 8 parts by weight of a liquid epoxy resin having two or more epoxy groups, C: 2 to 8 parts by weight of a resol-type phenol resin, and D: 0.5 to 5 parts by weight of a curing agent for an epoxy resin, wherein a viscosity is not more than 1000 Pa·s.

As described above, the copper particles are easily oxidized in a high temperature and high humidity environment. Therefore, the copper particles have a disadvantage in that the electric resistance is increased. According to the present invention, it is possible to inhibit oxidation of copper in an environment of high temperature and high humidity by coating the surface of the copper particles with silver to overcome disadvantages of copper, such as easy oxidation, while maintaining the advantageous features of the copper particles, such as low cost and comparatively low electric resistance. In cases where the surface of the copper particles have been partially exposed in spite of being coating with silver, an increase in electric resistance can be inhibited by reducing the oxidized copper particles using the reducing capability of a resol-type phenol resin.

To maintain electrical resistance at a low level, a required amount of silver to the total amount of the copper particles and silver coated on the surface thereof is 0.5% by weight. When the amount of silver is less than 0.5% by weight, the copper particles are oxidized more easily and electrical resistance is increased. On the other hand, when the amount of silver exceeds 20% by weight, it becomes difficult to oxidize the copper particles, but, cost increases because of an increase in amount of silver. Furthermore, migration of silver occurs more easily and the electrical connection reliability between vias is lowered. Therefore, the proportion of silver to the total amount of the copper particles and silver coated on the surface thereof is preferably from 0.5% to 20% by weight, and more preferably from 2% to 15% by weight.

The diameter of the copper particles to be coated with silver preferably is from 1 to 10 µm to provide viscosity characteristics suitable for screen printing. Preferably, copper particles produced by an electrolysis method, a reducing method, or an atomizing method are used. The copper particles produced by said methods satisfy the above particle diameter range, have small specific surface area, and have a generally spherical shape.

As a method of coating the surface of the copper particles with silver, a plating method, which coats the surface of copper as uniformly as possible, is preferred. When copper is exposed because of uneven plating, oxidation proceeds from the exposed copper portion and the electrical resistance is increased. Therefore, it is preferred to plate the copper particles such that uneven plating is avoided.

The above silver-coated copper particles preferably are blended in the amount of 86 to 95 parts by weight to serve as a conductor.

A typical liquid epoxy resin having two or more epoxy groups includes, for example, liquid epoxy resins, such as a bisphenol A-type epoxy resin, a bisphenol F-type epoxy resin, an alicyclic epoxy resin, an amine-type epoxy resin, an epoxy resin with a naphthalene skeleton, or an epoxy resin prepared by glycidyl esterification of dimer acid. In general, these resins can be appropriately used by blending.

A liquid epoxy resin has superior electrical insulating properties, but does not have a reducing capability. Therefore, by using the epoxy resin in combination with a resol-type phenol resin described below, it is possible to avoid a disadvantage of the resol-type phenol resin while making the use of the advantageous features of a highly reducing resol-type phenol resin.

Although a resol-type phenol resin has superior reducing properties, when using only a resol-type phenol resin as a binder resin in a via-filling conductive paste, the electrical connection reliability is reduced by influences of a heating cycle because the resol-type phenol resin itself is brittle.

In addition, because the resol-type phenol resin typically is a solid, it must be dissolved in a solvent when used. When the amount of the solvent required to dissolve the resin is large, the resulting composition is not suitable as a via-filling conductive paste. Accordingly, it is preferred to use a resin prepared by mixing a liquid epoxy resin with a resol-type phenol resin. The weight mixing ratio of the liquid epoxy resin to the resol-type phenol resin preferably is from 1:4 to 4:1, and this ratio varies depending on the kind of the liquid epoxy resin and resol-type phenol resin to be used.

A common curing agent can be used as the curing agent. Typically, an amine curing agent can be used, such as diciandiamide, hydrazide carboxylate, and the like; a urea curing agent, such as 3-(3,4-dichlorophenyl)-1,1-dimethylurea, and the like; an acid anhydride curing agent, such as phthalic anhydride, pyromellitic anhydride, hexahydrophthalic anhydride, methyl nadic anhydride, and the like; and an aromatic amine (amine adduct) curing agent, such as diaminodiphenylmethane, diaminodiphenylsulfone, and the like. Among them, a solid potential curing agent is particularly preferred in view of the stability and workability of the composition. A "solid potential curing agent" refers to those agents having the following function. In particular, when cooling to room temperature after heating to a predetermined reaction temperature, several types of amine agent and an epoxy resin react to some extent to convert the resin into particles, resulting in a state where an active group, such as amine, is incorporated into a three-dimensional configuration of the polymer. Consequently, the reaction is terminated in the state where the surface of the particles of the resin is partially reacted, and can be stored at room temperature for a long time without changing properties. When heating to a predetermined temperature or higher, the resin particles are molten or dissolved and the incorporated active group appears and, at the same time, the reaction initiates a rapid cure of the resin.

To achieve electrical connection reliability, the liquid epoxy resin and resol-type phenol resin preferably are blended in an amount of 2 to 8 parts by weight, respectively. To provide a predetermined curing, the curing agent preferably is blended in the amount of 0.5 to 5 parts by weight. However, when the amount of the organic binder comprising the liquid epoxy resin, resol-type phenol resin, and curing agent is too large, electrical resistance increases. On the other hand, when the amount of binder is too small, a paste is not obtained. Therefore, the total amount of the organic binder preferably is from 5 to 14 parts by weight.

The solvent basically is used to adjust the viscosity of the conductive paste composition. However, when the solvent boiling point is too low, the solvent evaporates during via-filling to increase composition viscosity, and it becomes impossible to print. Therefore, a solvent having a boiling point of at least 150° C. is preferred. Examples of the solvent include butyl cellosolve, butyl cellosolve acetate, ethyl cellosolve, ethyl cellosolve acetate, butyl carbitol, butyl carbitol acetate, ethyl carbitol, ethyl carbitol acetate, 2,2,4-trimethylpentandiol monoisobutyrate, and the like, but are not limited thereto.

The lower the amount of the solvent, the better. This is because an interlayer connection is provided by filling the conductive paste composition in vias, removing the solvent sandwiched between copper foils on both sides, and curing by heating. Therefore, when the amount of solvent is high, the filling volume after drying is reduced and it becomes difficult to form an electrical connection. If solvent remains, voids are formed in vias in the case of being sandwiched between copper foils and curing by heating, resulting in electrical connection failure.

However, because it is necessary that the viscosity of the conductive paste composition on printing is adjusted to 1000 Pa·s or lower to provide printability, the addition of the solvent is required at times. Also, in this case, the amount of the solvent preferably is not more than 5 parts by weight per 100 parts by weight of the silver-coated copper particles and organic binder.

When the amount of the solvent exceeds 5 parts by weight, volume shrinkage of the conductive paste composition after drying increases, and electrical connection becomes unstable.

An example of a case where the conductive paste composition of the present invention actually is used is described below.

That is, a prepreg (made of a material such as glass epoxy, paper phenol, composite, aramid epoxy, etc.) of a printed circuit board is perforated using means such as a drill, punching, laser, and the like to form holes, and the holes are filled with a conductive paste composition of the present invention. After drying, copper foils are laminated on both sides, and an interlayer connection is formed by heating under pressure. Then, a circuit is formed by etching to make a circuit board. A multilayer circuit board can be made by laminating a prepreg filled with the conductive paste composition of the present invention on the circuit board made as described above, laminating copper foils on both sides, curing the laminate by heating, and forming a circuit by etching. A desired circuit board having a multilayer configuration can be made by repeating these steps in order.

As described above, a conductive paste composition of the present invention can be utilized by filling in vias of a prepreg to form an interlayer electrical connection.

In another aspect, it can also be used as a through hole-filling conductive paste for an interlayer electrical connection of a printed circuit board whose circuit is formed by heat curing.

The via-filling conductive paste composition of the present invention is specifically described below.

The metal powders are described in detail in Table 1.

TABLE 1

| Metal Powders | Copper Particles | Coating Weight of Silver (% by weight) |
|---|---|---|
| Metal Powder a | Reducing Method 4 μm | 0 |
| Metal Powder b | Reducing Method 4 μm | 1 |

TABLE 1-continued

| Metal Powders | Copper Particles | Coating Weight of Silver (% by weight) |
|---|---|---|
| Metal Powder c | Reducing Method 4 μm | 5 |
| Metal Powder d | Reducing Method 4 μm | 10 |
| Metal Powder e | Reducing Method 4 μm | 20 |
| Metal Powder f | Reducing Method 4 μm | 30 |
| Metal Powder g | Atomizing Method 6 μm | 5 |
| Metal Powder h | Atomizing Method 8 μm | 2 |
| Metal Powder i | Electrolysis Method 5 μm | 5 |
| Metal Powder j | Electrolysis Method 5 μm | 10 |

A metal powder shown in Table 1, and an organic binder and a solvent shown in Table 2, were blended in a proportion (parts by weight) shown in Table 2, and then kneaded by using a triple roll mill to obtain a paste.

An epoxy resin prepared by mixing bisphenol A-type Epicoat 828 (manufactured by Yuka Shell Epoxy Corp.) with bisphenol F-type Epicoat 807 (manufactured by Yuka Shell Epoxy Corp.) in a weight ratio of 3:7 was used.

PL-2211 (manufactured by Showa Kobunshi Corp.) was used as a resol-type phenol resin.

MY-24 (manufactured by Ajinomoto Corp.) was used as a solid potential curing agent.

Butyl carbitol acetate was used as the solvent.

The prepreg was a composite-type prepreg, that is, a prepreg obtained by blending an epoxy resin and an alumina powder in a proportion of 12% by weight and 88% by weight, respectively, then forming the blend into a sheet-shaped article having a thickness of 200 μm, and forming holes having a diameter of 200 μm in this sheet-shaped article using a punch. This sheet is a state of a prepreg and is not completely cured.

A plate wherein copper is laminated on both sides (double-sided copper-laminated plate) was made by filling the paste described in Table 2 in holes of the above sheet, drying at 120° C. for 5 minutes, sandwiching the sheet between copper foils (thickness:18 μm) from both sides and pressing with heating at a temperature of 180° C. under a pressure of 50 kg/cm$^2$ for 60 minutes using a hot press.

This double-sided copper-laminated plate was etched using a known method to form an electrode pattern. An electric resistivity per one via hole is shown in Table 2. This board was subject to PCT (pressure cooker test: 121° C., 100 hours) and an electric resistance per one via hole was measured, and then a change in increase from the initial resistivity was calculated (0% means no change in resistivity, while 100% means that the initial resistivity is doubled).

TABLE 2

| | Metal Powders | Organic Binder (Epoxy Resin/Resol-type Phenol Resin/Curing Agent) | Amount of Solvent | Paste Viscosity (Pa · s) | Via Resistivity (Mω) | Change in Resistivity after PCT (%) |
|---|---|---|---|---|---|---|
| Preferred Ex. 1 | b 90 | 10 (4.5/4.5/1) | 3 | 272 | 1.7 | 85 |
| Preferred Ex. 2 | c 90 | 10 (4.5/4.5/1) | 4 | 260 | 1.7 | 46 |
| Preferred Ex. 3 | d 90 | 10 (4.5/4.5/1) | 4 | 314 | 1.6 | 58 |
| Preferred Ex. 4 | e 90 | 10 (4.5/4.5/1) | 4 | 378 | 1.6 | 44 |
| Preferred Ex. 5 | g 90 | 10 (4.5/4.5/1) | 3 | 177 | 2.1 | 80 |
| Preferred Ex. 6 | h 90 | 10 (4.5/4.5/1) | 3 | 238 | 2.4 | 92 |
| Preferred Ex. 7 | i 88 | 12 (5.5/5.5/1) | 5 | 376 | 2.0 | 66 |
| Preferred Ex. 8 | j 88 | 12 (5.5/5.5/1) | 5 | 422 | 1.9 | 75 |
| Preferred Ex. 9 | c 88 | 12 (5.5/5.5/1) | 3 | 266 | 2.9 | 72 |

TABLE 2-continued

|  | Metal Powders | Organic Binder (Epoxy Resin/Resol-type Phenol Resin/Curing Agent) | Amount of Solvent | Paste Viscosity (Pa·s) | Via Resistivity (Mω) | Change in Resistivity after PCT (%) |
| --- | --- | --- | --- | --- | --- | --- |
| Preferred Ex. 10 | c 92 | 8 (3.6/3.6/0.8) | 5 | 337 | 1.6 | 88 |
| Preferred Ex. 11 | c 95 | 5 (2.2/2.2/0.6) | 5 | 671 | 1.4 | 95 |
| Preferred Ex. 12 | c 90 | 10 (6/2.8/1.2) | 3 | 245 | 1.6 | 62 |
| Preferred Ex. 13 | c 90 | 10 (2/7.5/0.5) | 5 | 776 | 1.6 | 82 |
| Comparative Ex. 1 | a 90 | 10 (4.5/4.5/1) | 3 | 256 | 1.8 | 670 |
| Comparative Ex. 2 | f 90 | 10 (4.5/4.5/1) | 5 | 498 | 1.6 | 68 |
| Comparative Ex. 3 | c 85 | 15 (7/7/1) | 1 | 121 | 13.7 | 49 |
| Comparative Ex. 4 | c 97 | 3 (1.4/1.4/0.2) | 5 | impossible to obtain paste | | |
| Comparative Ex. 5 | c 92 | 8 (3.6/3.6/0.8) | 7 | 256 | 7.7 | 1000< |
| Comparative Ex. 6 | c 95 | 5 (2.2/2.2/0.6) | 7 | 427 | 14.2 | 1000< |
| Comparative Ex. 7 | c 90 | 10 (8/0/2) | 1 | 163 | 1.8 | 153 |
| Comparative Ex. 8 | c 90 | 10 (0/10) | 5 | 1628 | impossible to fill in Via | |
| Comparative Ex. 9 | c 90 | 10 (0/10) | 8 | 434 | 25.0 | 1000< |

In Table 2, those examples having a via resistivity of not more than 3 mΩ and a change in resistivity after PCT of not more than 100% are preferred.

Regarding copper particles free of a silver coating in Comparative Example 1, the via resistivity is low, but a change in resistivity after PCT is very large.

When using copper particles coated with 30% by weight of silver in Comparative Example 2, the change in resistivity after PCT is acceptable. However, the production cost is increased and, therefore, is not economically practical.

In Comparative Example 3, because the amount of the organic binder is large, such as 15 parts by weight, the via resistivity is large.

In Comparative Example 4, because the amount of organic binder is too small, such as 3 parts by weight, a paste could not be obtained even if a solvent was added in an amount of 5 parts by weight.

In Comparative Examples 5 and 6, because the amount of the solvent to 100 parts by weight of the silver-coated copper particles and organic binder is large, such as 7 parts by weight, the via resistivity is large and the change in resistivity after PCT is more than 1000%.

When the epoxy resin is used alone as in Comparative Example 7, the change in resistivity after PCT is large.

When the resol-type phenol resin is used alone as in Comparative Example 8, the paste could not be filled in the vias because the viscosity of the paste became too large.

When the viscosity of the paste is reduced by increasing the amount of the solvent to 8 parts by weight as in Comparative Example 9, it is possible to fill the paste in vias. However, the via resistivity is large and the change in resistivity after PCT is very large.

Contrary to these Comparative Examples, Preferred Examples 1 to 13 show good results, such as low via resistivity and small change in resistivity after PCT because they comprise the silver-coated copper particles and organic binder and solvent blended within the range of the present invention.

According to the present invention, there can be provided a conductive paste composition, which is superior in electrical connection reliability and has properties required of a via-filling conductive paste composition.

What is claimed is:

1. A via-filling conductive paste composition for filling vias of a printed circuit board comprising a solvent in an amount of not more than 5 parts by weight per 100 parts by weight of the total amount of components A to D:

A: 86 to 95 parts by weight of silver-coated copper particles prepared by coating a surface of copper particles having an average particle diameter of 1 to 10 μm with silver, a proportion of silver to a total amount of copper particles and coated silver being from 0.5 to 20% by weight, B: 2 to 8 parts by weight of a liquid epoxy resin having two or more epoxy groups, C: 2 to 8 parts by weight of a resol phenol resin or a resol phenol resin derivative, and D: 0.5 to 5 parts by weight of a curing agent for an epoxy resin, wherein the composition has a viscosity of 1000 Pa·s or less.

2. The via-filling conductive paste composition of claim 1 wherein the silver-coated copper particles are made by coating copper particles produced by an electrolysis method, a reducing method, or an atomizing method, with silver.

3. The via-filling conductive paste composition of claim 1 wherein the silver-coated copper particles are made by coating the surface of copper particles with silver using a plating method.

4. The via-filling conductive paste composition of claim 2 wherein the silver-coated copper particles are made by coating the surface of copper particles with silver using a plating method.

* * * * *